US006156969A

United States Patent [19]

Schütz

[11] Patent Number: 6,156,969

[45] Date of Patent: Dec. 5, 2000

[54] TRANSPORT AND STORAGE CONTAINER FOR LIQUIDS

[75] Inventor: Udo Schütz, Selters-Westerwald, Germany

[73] Assignee: Protechna S.A., Fribourg, Switzerland

[21] Appl. No.: 09/286,923

[22] Filed: Apr. 6, 1999

[30] Foreign Application Priority Data

Apr. 6, 1998 [DE] Germany ........................... 198 15 082

[51] Int. Cl.[7] ........................................ H05K 5/00

[52] U.S. Cl. .................. 174/17 LF; 174/51; 174/40 CC; 439/92; 439/98; 361/799

[58] Field of Search ................................ 174/51, 40 CC, 174/50, 52.1, 58, 6, 135, 17 LF; 220/3.2; 439/92, 98; 361/799

[56] References Cited

U.S. PATENT DOCUMENTS

| | | | |
|---|---|---|---|
| 1,931,373 | 10/1933 | Clark | 336/94 |
| 3,697,924 | 10/1972 | Oliver | 439/97 |
| 4,283,592 | 8/1981 | Brownell, Jr. | 174/21 R |
| 4,960,964 | 10/1990 | Schnell et al. | 174/51 |
| 5,866,844 | 2/1999 | Osterbrock et al. | 174/51 |
| 5,909,005 | 6/1999 | Boston | 174/6 |
| 5,932,954 | 8/1999 | Kwon | 313/313 |
| 5,942,725 | 8/1999 | Daoud | 174/51 |
| 6,011,218 | 6/2000 | Burek et al. | 174/40 CC |

FOREIGN PATENT DOCUMENTS

| | | | |
|---|---|---|---|
| 0014491 | 8/1980 | European Pat. Off. . | |
| 0699599 | 3/1996 | European Pat. Off. . | |
| 2518812 | 6/1983 | France | 174/17 LF |
| 195 11 723 C1 | 8/1996 | Germany . | |

*Primary Examiner*—Kristine Kincaid
*Assistant Examiner*—Dhiru Patel
*Attorney, Agent, or Firm*—Friedrich Kueffner

[57] ABSTRACT

A transport and storage container for liquids with a pallet-like underframe of an electrically conductive material, an exchangeable inner container of synthetic material with four side walls, a bottom wall and a top wall, a closable inlet opening at the top and a lower outlet opening with a draining device, and an outer casing formed of grating or sheet metal. The transport and storage container for liquids further includes a grounding member of an electrically conductive material, preferably metal, arranged in the passage opening of the discharge device between the discharge valve of the discharge device and the inner container, wherein the grounding member is connected to an electrically conductive connecting element, preferably a screw of metal with a grounding connection to the underframe of the container, wherein the connecting element is introduced from the outside.

7 Claims, 1 Drawing Sheet

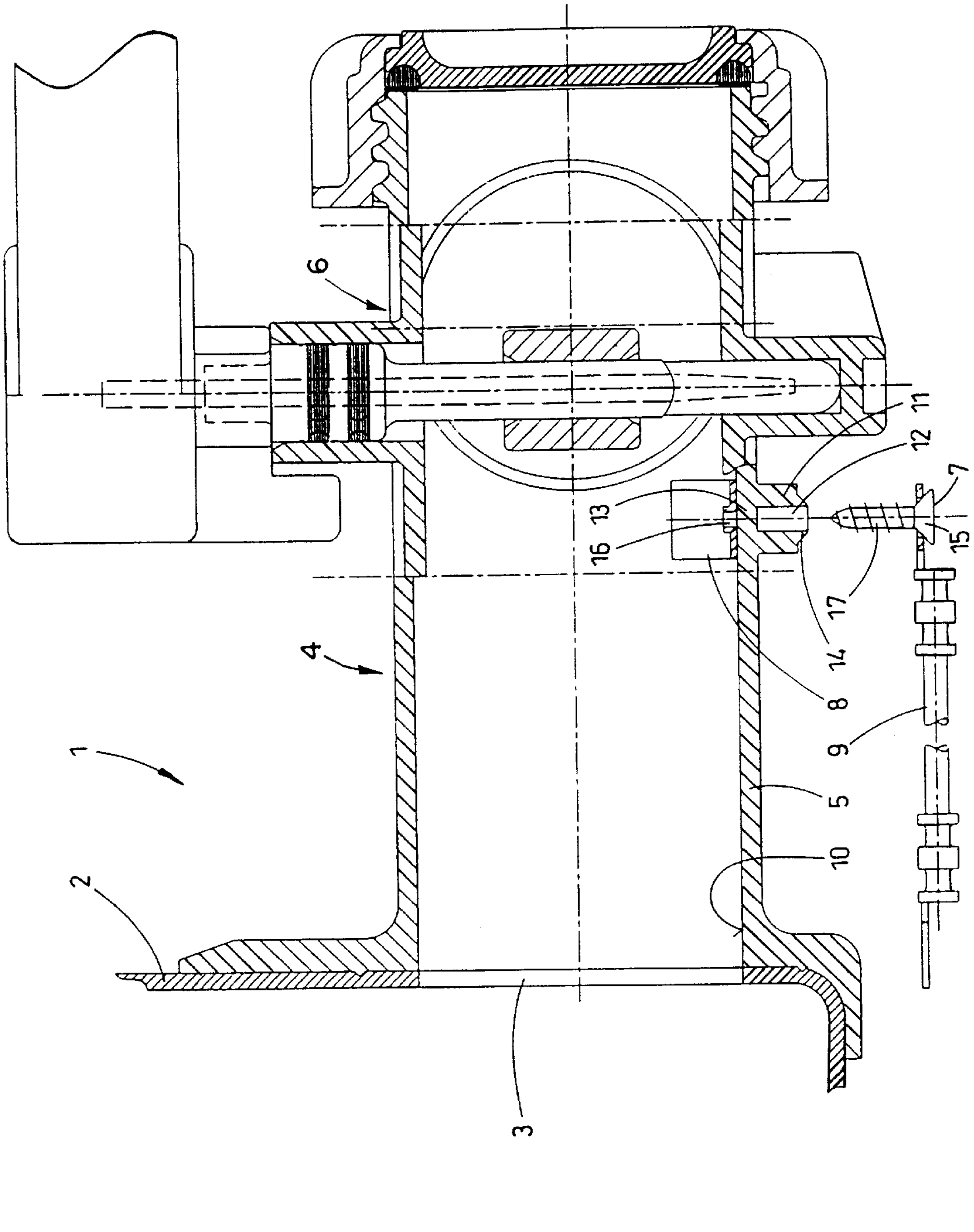
1
2
3
4
5
6
7
8
9
10
11
12
13
14
15
16
17

TRANSPORT AND STORAGE CONTAINER FOR LIQUIDS

BACKGROUND OF THE INVENTION

1. Field of the Invention

The present invention relates to transport and storage containers for liquids with a pallet-like underframe of an electrically conductive material, an exchangeable inner container of synthetic material with four side walls, a bottom wall and a top wall, a closable inlet opening at the top and a lower outlet opening with a draining device, and an outer casing formed of grating or sheet metal.

2. Description of the Related Art

When liquid containers of this type known from DE 195 11 723 C1 are filled and emptied and when liquids are stirred in this type of containers, for example, for mixing purposes, electric charges may occur as a result of liquid friction. The principal danger of electrostatic charging is the fact that ignition sources come into contact with explodable mixtures of gases and vapors.

Because of the electrostatic charging capability, transport and storage containers of the above-described type cannot be used in explosion-endangered rooms and cannot be filled with explosive liquids.

EP 0 699 599 A1 describes an electrically grounded packing container for storing and transporting solid, liquid and pasty products, wherein the container can be used as a self-supporting container or as an inliner or inset container for use in supporting outer containers, such as corrugated cardboard boxes, wood boxes, grate box pallets or drums. The packing container is composed of a multiple-layer composite foil combination which is constructed from a polymer foil with locking layer properties serving as the external layer of the container, an intermediate layer of an electrically conductive material and another polymer foil forming the inner layer of the packing container. The inner layer of the packing container is perforated, so that electrostatic charges which collect in the filling material can flow through the openings provided in the inner layer to the electrically conductive intermediate layer which is in connection through electrical contact points to a grounding system.

EP 0 014 491 A1 discloses a double-wall storage tank for combustible liquids, wherein the storage tank includes an outer wall of steel and a monitoring chamber which is constructed as an inner wall of synthetic material and can be connected to a leakage indicating device which can be operated at excess pressure or negative pressure. For electrically grounding the storage tank, the inner wall surface of the inner wall of synthetic material which faces the storage liquid is covered with a metal wire grating of the type of a Faraday cage which is connected to a grounding terminal in the tank cover of steel.

The electric grounding of the packing container known from EP 0 699 599 A1 which is constructed as a composite layer container by providing an intermediate layer of an electrically conductive material, as well as grounding of the double-wall storage tank in accordance with EP 0 014 451 A1 by a wire grating placed on the inner surface of the inner wall of synthetic material, are both technically complicated solutions.

SUMMARY OF THE INVENTION

Therefore, it is the primary object of the present invention to electrically ground in a simple manner the transport and storage container for liquids of the above-described type in order to avoid an electrostatic charging during filling with liquids and when removing the liquids.

In accordance with the present invention, the transport and storage container for liquids includes a grounding member of an electrically conductive material, preferably metal, arranged in the passage opening of the discharge device between the discharge valve of the discharge device and the inner container, wherein the grounding member is connected to an electrically conductive connecting element, preferably a screw of metal with a grounding connection to the underframe of the container, wherein the connecting element is introduced from the outside.

As a result of the configuration according to the present invention, electric charges which may be formed due to liquid friction during filling and emptying of the transport and storage container and during stirring of liquids in the container, for example, for mixing purposes, can be discharged into the ground through the grounding member, the screw, the grounding connection and the pallet-like underframe which is also of an electrically conductive material.

By arranging the grounding member in the passage opening of the discharge device, in which during the removal of liquid from the container the greatest liquid friction occurs in the container as a result of the discharge velocity of the liquid, an electrostatic charging of the container is prevented in a simple and effective manner. The electric grounding of the inner chamber of the inner container of synthetic material and the liquids to be transported and stored therein, facilitates the use of the transport and storage container as a dangerous material container for combustible liquids and emulsions, such as solvents, paints and varnishes with a flash point of <35° C., and the use of the container in work rooms in which an explosive atmosphere may be formed by gases, vapors or mists.

The various features of novelty which characterize the invention are pointed out with particularity in the claims annexed to and forming a part of the disclosure. For a better understanding of the invention, its operating advantages, specific objects attained by its use, reference should be had to the following descriptive matter in which there are described preferred embodiments of the invention.

BRIEF DESCRIPTION OF THE DRAWING

In the drawing:

The single FIGURE of the drawing is a partial sectional view of a discharge device of a transport and storage container

DESCRIPTION OF THE PREFERRED EMBODIMENTS

The transport and storage container 1 partially shown in the drawing, which can be used as a disposable container and a reusable container, includes as principal components a replaceable inner container 2 of polyethylene with four side walls, a bottom wall constructed as a draining bottom, an upper wall with an inlet connection which is closable by a screw cover, and a lower outlet opening 3 with a discharge device 4 composed of a discharge connection 5 with a discharge valve 6, an outer casing of metal constructed as a wall of grating, a pallet-like underframe with a bottom basin of sheet metal for receiving with frictional engagement the inner container 2 of synthetic material, and two cover struts of metal for protecting the inner container 2.

The bottom basin rests with a certain bottom clearance on corner and middle legs and a bottom frame or skids, so that the gripping arms of a transport device, for example, a forklift, can be moved from four sides underneath the bottom basin for transporting the transport and storage container. The legs and the bottom frame or skids are of metal or an electrically conductive synthetic material, for example, polyethylene with a conductive soot portion. The pallet-like underframe of the transport and storage container 1 has length and width dimensions conforming to European standards.

A grounding member 8 of metal is arranged in the passage opening 10 of the discharge device 4 between the inner container 2 and the discharge valve 6. The grounding member 8 is in contact with a screw 7 of metal which is screwed into the discharge device 4 from the outside and which is connected through a grounding cable 9 to the pallet-like underframe of the container 1, such that electric charges can be conducted into the ground through the grounding member 8, the connecting element constructed as the screw 7, the grounding cable 9 and the underframe of the container.

For receiving the screw 7 the outlet connection 5 is provided radially of the passage opening 10 of the discharge device 4 with an outwardly directed threaded connection 11 which has an outwardly open blind-end bore 12 into which the screw 7 can be screwed. The screw 7 penetrates the wall 13 of the outlet connection of the discharge device 4 when the screw 7 is screwed into the blind-end bore 12.

The threaded connection 11 has at its free end an annular protrusion 14 for sealing the screw 7 when the screw head 14 is tightly screwed against the annular protrusion 14, wherein the screw 7 is additionally sealed by the thread thereof.

The grounding member 8 is constructed as a piece of sheet metal extending over a portion of the inner circumference of the passage opening 10 of the discharge device 4, wherein a middle opening 16 of the piece of sheet metal receives the shaft 17 of the screw 7, wherein the grounding member 8 is tightly braced against the wall of the passage opening 10.

The grounding member 8 and the screw 7 are preferably of high-grade steel.

The grounding member 8 can also be arranged at different locations of the chamber of the container 1 filled with liquid, for example, at the inner container 2, wherein, in that case, the threaded connection 11 is provided at the corresponding location of the outer wall of the inner container 2.

While specific embodiments of the invention have been described in detail to illustrate the inventive principles, it will be understood that the invention may be embodied otherwise without departing from such principles.

I claim:

1. A transport and storage container for liquids comprising a pallet-like underframe of an electrically conductive material, an exchangeable inner container of synthetic material with four side walls, a bottom wall and an upper wall with a closable inlet opening, and a lower outlet opening with a draining device having a passage opening, and an outer casing constructed of grating or sheet metal, further comprising a grounding member of an electrically conductive material mounted in the passage opening of the draining device between a discharge valve of the draining device and the inner container for discharging electric charges which may be formed due to liquid friction during filling and emptying of the transport and storage container, and an externally mounted electrically conductive connecting element comprising a grounding connection to the underframe of the container.

2. The container according to claim 1, wherein the grounding member is of metal.

3. The container according to claim 1, wherein the connecting element is a screw of metal.

4. The container according to claim 3, wherein the grounding member and the screw are of high-grade steel.

5. The container according to claim 1, further comprising an outwardly directed threaded connection arranged so as to extend radially of the passage opening of the draining device, wherein the threaded connection has an outwardly open blind-end bore for receiving the connecting element, and wherein the connecting element is mounted in the blind-end bore of the threaded connection such that a wall of the draining device is penetrated by the connecting element.

6. The container according to claim 5, wherein the threaded connection comprises at a free end thereof an annular protrusion for sealing the connecting element.

7. The container according to claim 1, wherein the grounding member is comprised of a curved piece of sheet metal extending over a portion of an inner wall of the passage opening of the draining device, the piece of sheet metal having a middle opening for receiving the connecting element.

* * * * *